United States Patent [19]

Claverie

[11] 3,921,008

[45] Nov. 18, 1975

[54] WIDE DYNAMIC RANGE LOGARITHMIC AMPLIFIER ARRANGEMENT

[75] Inventor: Claude Claverie, Paris, France

[73] Assignee: Thomson-CSF, Paris, France

[22] Filed: Feb. 21, 1974

[21] Appl. No.: 444,660

[30] Foreign Application Priority Data

Feb. 27, 1973 France .............................. 73.06904

[52] U.S. Cl. .................................. 307/230; 328/145

[51] Int. Cl.² ........................................... G06G 7/12

[58] Field of Search ............. 307/229, 230; 328/145

[56] References Cited

UNITED STATES PATENTS

| | | | |
|---|---|---|---|
| 3,369,128 | 2/1968 | Pearlman | 328/145 |
| 3,417,263 | 12/1968 | Thomas | 328/145 |
| 3,448,289 | 6/1969 | Harris | 307/230 |
| 3,624,409 | 11/1971 | Folsom et al. | 307/230 |
| 3,790,819 | 2/1974 | Chamran | 307/230 |

*Primary Examiner*—Stanley D. Miller, Jr.
*Attorney, Agent, or Firm*—Cushman, Darby & Cushman

[57] ABSTRACT

The arrangement conventionally comprises a high gain differential amplifier with a negative feed back transistor; a compensating circuit with resistors compensates for the voltage drops occurring due to the parasitic resistances of the transistor; a limiting circuit, comprising a unidirectional conduction device, brings to a minimum threshold value those values of the input signal which lie below this threshold value.

4 Claims, 2 Drawing Figures

WIDE DYNAMIC RANGE LOGARITHMIC AMPLIFIER ARRANGEMENT

The present invention relates to a wide-band, wide dynamic range logarithmic amplifier, in particular for amplifying video frequency signals.

The majority of logarithmic amplifiers utilise the property of semi-conductor junctions in accordance with which a voltage appears at their terminals, which is a logarithmic function of the current flowing through them and to this end comprise linear, high-gain amplifiers associated with junction-type semi-conductor elements, diodes or transistors. However, the voltage-current characteristics of junction-type elements are strictly logarithmic only for weak current values of the order of some few tens of microamps; for values of the current through a junction, in the order of some few milliamps, the voltage drops, due in particular to the resistance of the material supporting the junction and to the contact resistances, become appreciable and the characteristic of the element accordingly deviates from a logarithmic law.

In order to extend the operating range of a logarithmic amplifier, it is well known to utilise compensating circuits in order to compensate the effects of voltage drops in the junction element and to thus make it possible to utilise the characteristic of the junction up to high current levels.

The compensating circuits utilised are generally complex in nature and their introduction sometimes requires the use of high-impedance circuits at the output of the logarithmic amplifier.

On the other hand, it is necessary to limit the operating range of the logarithmic amplifier toward low levels of the input signal; otherwise, the noise components and low-amplitude parasitic signals which occur, are amplified because of the logarithmic characteristic, to a greater extend than the effective signals of higher amplitude, and this reduces the signal-to-noise ratio.

The known compensating circuits do not readily lend themselves to the adjunction of devices for imparting a minimum threshold value to the signal being amplified.

The object of the present invention is a logarithmic amplifier which does not exhibit the aforementioned drawbacks.

According to the invention, there is provided a logarithmic amplifier arrangement, having an input and an output and comprising:

a differential amplifier having first and second inputs and an output forming the output of said arrangement;

a junction type semi-conductor element, connected between said first input and said output of said differential amplifier;

a compensating circuit formed by first and second resistors connected to said second input of said differential amplifier and, respectively, ground and the input of said arrangement, for compensating the voltage drops produced by the parasitic resistances of said semi-conductor element;

a limiting circuit having an input connected to said input of the arrangement and an output connected to said first input of said differential amplifier for bringing to a minimum threshold value those values of the input signal lying below this threshold value.

The invention will be better understood and other of its features rendered apparent, from a consideration of the ensuing description and the related drawings in which.

Figure 1:
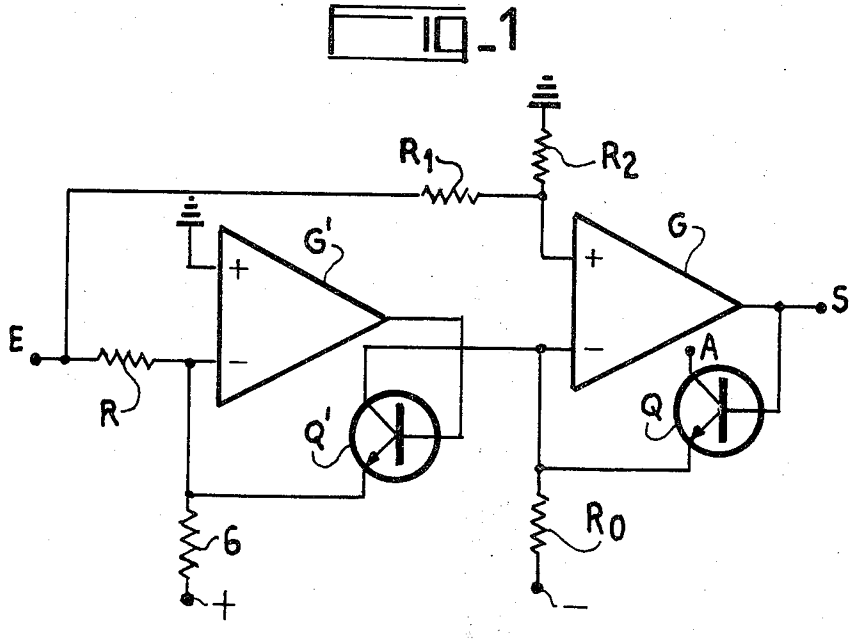
FIG. 1 shows in a schematic way a logarithmic amplifier according to the invention.

The logarithmic amplifier arrangement of FIG. 1, which, in this example, is designed for amplifying negative polarity signals, comprises a circuit constituted in the convential way by a differential amplifier G of high gain, by a transistor Q of n-p-n type whose base-emitter junction is arranged as a negative feedback element between the ouput S and the input "–" (inverted input) of the amplifier G and whose collector is connected at A to a positive direct voltage source.

A limiting circuit, preventing the input "–"of the amplifier G from receiving signals of very small amplitude couples the input E of the circuit to the input "–"of the amplifier G. This limiting circuit comprises on the one hand a high-gain differential amplifier, G′, whose "+" input is grounded and whose "–" input is connected to the input of the arrangement, E, through a resistor R, and on the other hand a transistor Q′ of the n-p-n type, connected by its base and its emitter respectively to the output and to the "–" input of the amplifier G′, and connected by its collector to the "–" input of the amplifier G. The limiting circuit further comprises a resistor 6 coupling a terminal + designed to receive a fixed positive voltage, to the "–" input of the differential amplifier G′.

The arrangement further comprises a resistor $R_0$ coupling a terminal –, designed to receive a fixed negative voltage, to the "–" input of the differential amplifier G, and a compensating circuit formed by two resistors $R_1$ and $R_2$ respectively linking the "+" output (non-inverted input) of the amplifier G to the input of the arrangement and to ground.

The collector of the transistor Q′ supplies a current proportional to the voltage applied to the input of the amplifier G′ when this voltage is negative, and a zero current when it is positive, the transistor Q′ being blocked in the second case.

The operation of the arrangement will first be explained disregarding the limiting circuit, i.e., assuming the second terminal of the resistor R to be directly coupled to the input "–" of the amplifier G and the resistor $R_0$ to be disconnected.

If a negative voltage $V_e$, is applied to the input E of the circuit, the voltages at the inputs of the amplifier G are substantially equal to $$\frac{R_2}{R_2+R_1}\cdot V_e\ .$$

The current $I$ flowing through the resistor R and the base-emitter junction of the transistor being proportional to the input voltage $V_e$, and the voltage difference between the base and emitter electrodes of the transistor being $$V = A\ \ln\ \left(\frac{I+I_0}{I_0}\right) + rI$$

($A$ and $I_0$ being coefficients which are independent of the input voltage), where the first term corresponds to the voltage between the terminals of a junction and where the second term represents the voltage drops, due to parasitic resistances, which it is required to correct. The output voltage of the circuit at the point S is:

$$V_s = A \ln \left(\frac{I + I_o}{I_o}\right) + r\,I + \frac{R_2}{R_2+R_1} V_e$$

The logarithmic amplification characteristic is achieved when the term $$\frac{R_2}{R_2+R_1} \cdot V_e,$$

superimposed upon the output voltage of the circuit by the compensating circuit, exactly compensates the term $r\,I$ due to the parasitic resistances. The value of $r$ is determined experimentally for a sufficiently high level of the current $I$, and the values of the resistances R, $R_1$ and $R_2$ are chosen accordingly.

The increase in dynamic range obtained by the compensating circuit makes it possible to operate the junction-type element within the part of its characteristic which is the most interesting from the point of view of pass-band, that is to say towards high current levels; indeed, at low current levels, the dynamic resistance of a diode or a transistor becomes substantial so that the parasitic capacitance at the terminals of the element comes into play and has the effect of modifying the pass-band.

The compensating circuit makes it possible to exploit the logarithmic characteristic of the transistor up to a maximum value $I_1$ of the current through the junction, to which there corresponds a maximum amplitude $V_1$ of the input signal of the arrangement.

The desired dynamic range $K$ determines the minimum amplitude $V_2 = V_1/K$ of the input signal, to which amplitude the operation of the logarithmic amplifier can be limited in order to avoid the aforesaid drawbacks. The desired limitation is achieved by superimposing upon the input signal a positive direct component of amplitude equal to the minimum threshold amplitude $V_2$. This superimposition is achieved by means of the resistor 6, the terminal C of which receives a direct positive voltage. Thus, small values of the signal applied at E become positive and are substituted by a zero signal at the output of the transistor Q'. These zero values are substituted by the negative threshold voltage, at the time as the output voltage of the arrangement is made proportional to the logarithm of the input signal in the $(V_1/K)$ to $V_1$ range of values, by means of the resistor $R_0$ and the negative voltage applied to the terminal B of this resistor. Those elements are so chosen that the "−" input of the amplifier G receives a supplementary current $I_2$ practically equal to the current $(1_1/K)$ corresponding to the value of the limiting threshold.

Figure 2:
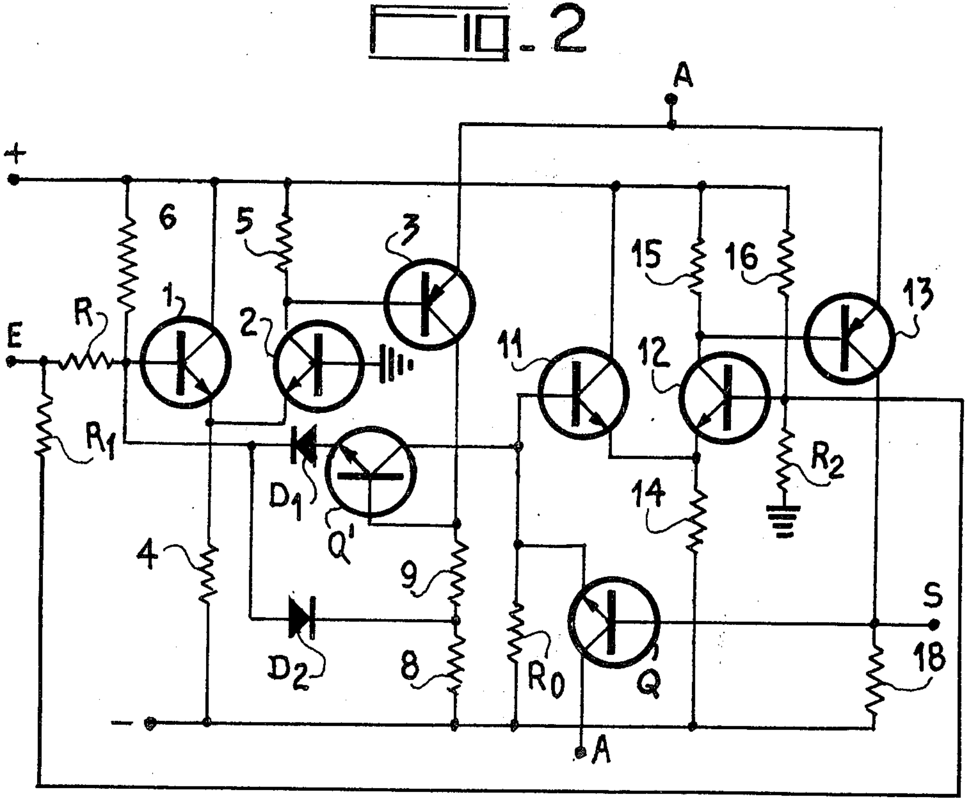
FIG. 2 is the detailed diagram of an amplifier according to the invention.

FIG. 2 illustrates, disregarding a slight improvement, a detailed embodiment of the logarithmic amplifier arrangement described hereinbefore.

The elements of the circuit which correspond to those of the preceding figure, have been indicated by the same letters and numbers.

The input E of the arrangement is coupled to the base of a transistor n-p-n,1, through a resistor R. The amplifier G' of FIG. 1 essentially comprises this transistor 1 and a further transistor n-p-n,2, connected as will be indicated. The base of the transistor 1 form the "−" input of the amplifier G' and is coupled to a positive direct voltage source through a resistor 6. The collector of the transistor 1 is directly coupled to the positive source and its emitter is coupled to a negative direct voltage source through a resistor 4. The transistor n-p-n 2, the emitter of which is connected to the emitter of the transistor 1, has its collector coupled to the positive direct voltage source through a resistor 5 and its base, forming the "+" input of the amplifier G', grounded.

The differential amplifier G' further comprises an output transistor 3, the base of which is coupled to the collector of the transistor 2; the emitter of transistor 3 is connected to the terminal A, and its collector forms the output of the amplifier G'. The base-emitter junction of the transistor Q' and a diode $D_1$ in series, are connected between the collector of the transistor 3 and the base of the transistor 1, i.e., between the output and the "−" input of the amplifier G'. Two resistors, 8 and 9, connected in series, are inserted between the collector of the transistor 3 and the negative direct voltage source.

The anode of a diode $D_2$ is coupled to the base of the transistor 1 and its cathode is connected to the point common to the resistors 8 and 9.

The amplifier G has the same structure as the amplifier G', the reference numbers of its elements being increased by 10 relatively to the corresponding elements of the amplifier G'; it thus comprises: two transistors n-p-n 11 and 12, two resistors 14 and 15, a transistor p-n-p, 13. Input "−" of the amplifier G, i.e. the base of the transistor 11, is coupled to the collector of the transistor Q'; input "+" of the amplifier G, i.e. the base of the transistor 12, is connected to the positive direct voltage source through a resistor 16, to ground through a resistor $R_2$, and to the input E through a resistor $R_1$.

The collector of the transistor 13, which is the output S of the arrangement, is coupled to the negative direct voltage source through a resistor 18 and to the base of the transistor Q; the emitter of this transistor is coupled to the "−" input of the amplifier G and to the negative direct voltage source through a resistor $R_o$. The emitter of the transistor 13 is connected to the same voltage source A, as the collector of the transistor Q.

The diode $D_2$ is designed to prevent an open-loop operation of the differential amplifier when the transistor Q' blocks, following a change in polarity of the input signal; such an operation would place the amplifier in a saturation state from which it could return to the proper operating condition only after a delay which would be of such length as to prejudice the response time of the arrangement. The diode $D_2$ is biased in order to take account of the conduction thresholds of the transistor Q' and the diodes $D_1$ and $D_2$, and, to this end, its cathode is connected, not to the collector of the transistor 3 like the base of the transistor Q', but to an intermediate point, common to the resistors 9 and 8, in the collector circuit of the transistor 3.

When the input signal becomes positive, the transistor Q' blocks and no signal is transmitted to the transistor Q, the diode $D_2$ then conducting and acting as a negative feedback element to ensure correct operation of the differential amplifier G'.

The diode $D_1$ also serves to improve the response time of the current source. When the transistor Q' is blocked, the rapid variations in the input signal are not transmitted until after a delay whose duration depends upon the parasitic capacitances of the transistor Q' and in particular upon the transition capacitance. The diode $D_1$ chosen for connection in series with the emitter of the transistor, has a parasitic capacitance at its terminals, which is substantially smaller than those of the transistor.

The logarithmic amplifier arrangements have been described in the context of transistors as the elements having logarithmic characteristics, although the same arrangements could of course be used with diodes arranged as negative feedback elements.

Of course, the invention is not limited to the embodiments described and shown which were given soleby by way of example.

What is claimed is:

1. A logarithmic amplifier arrangement having an input and an output and comprising: a differential amplifier having first and second inputs and an output forming the output of said arrangement; a junction type semi-conductor element, connected between said first input and said output of said differential amplifier; a compensating circuit formed by first and second resistors connected to said second input of said differential amplifier and, respectively, ground and the input of said arrangement, for compensating the voltage drops produced by the parasitic resistances of said semi-conductor element; and a limiting circuit having an input connected to said input of the arrangement and an output connected to said first input of said differential amplifier for bringing to a minimum threshold value those values of input signal lying below said threshold vlaue.

2. A logarithmic amplifier arrangement as claimed in claim 1 wherein said limiting circuit comprises: first means, having an output, for adding to the input signal of the arrangement a direct component of opposite polarity and having a substantially constant value corresponding to said threshold value; a unidirectional conduction device having an input coupled to said output of said first means and an output; and second means, having an output coupled to said first input of said differential amplifier, for shifting the values of the signal of said output of said unidirectional conduction device by a substantially constant value corresponding to said threshold value.

3. A logarithmic amplifier arrangement as claimed in claim 2 wherein said unidirectional conduction device comprises: an auxiliary differential amplifier having first and second inputs and an output, said first input forming the input of said unidirectional conduction device, said second input being grounded; and a transistor having its emitter and its base respectively connected to said first input and to said output of said auxiliary differential amplifier, the collector of said transistor forming said output of said unidirectional conduction device.

4. A logarithmic amplifier arrangement as claimed in claim 3 wherein said first means comprise a first voltage source and a third resistor coupling said first voltage source to said input of said unidirectional conduction device and wherein said second means comprise a second voltage source and a fourth resistor coupling said second voltage source to said output of said unidirectional conduction device.

* * * * *